(12) United States Patent
Piles Guillem et al.

(10) Patent No.: US 11,618,374 B2
(45) Date of Patent: Apr. 4, 2023

(54) SELECTIVELY ILLUMINABLE METALLIC LOOKING TRIMS AND THEIR METHODS OF MANUFACTURE

(71) Applicant: SRG Global Liria, S.L., Liria Valencia (ES)

(72) Inventors: Sergio Piles Guillem, Liria Valencia (ES); Juan Monleon, Liria Valencia (ES)

(73) Assignee: SRG Global Liria, S.L., Liria Valencia (ES)

( * ) Notice: Subject to any disclaimer, the term of this patent is extended or adjusted under 35 U.S.C. 154(b) by 0 days.

(21) Appl. No.: 17/288,271

(22) PCT Filed: Oct. 25, 2019

(86) PCT No.: PCT/EP2019/079206
§ 371 (c)(1),
(2) Date: Apr. 23, 2021

(87) PCT Pub. No.: WO2020/084121
PCT Pub. Date: Apr. 30, 2020

(65) Prior Publication Data
US 2021/0387570 A1 Dec. 16, 2021

(30) Foreign Application Priority Data
Oct. 25, 2018 (ES) .............. ES201831040

(51) Int. Cl.
*B60Q 3/20* (2017.01)
*B60R 13/02* (2006.01)
(Continued)

(52) U.S. Cl.
CPC .............. *B60Q 3/20* (2017.02); *B60R 13/02* (2013.01); *F21V 11/14* (2013.01);
(Continued)

(58) Field of Classification Search
None
See application file for complete search history.

(56) References Cited

U.S. PATENT DOCUMENTS

2015/0210226 A1 7/2015 Topart et al.
2015/0291085 A1* 10/2015 Manning ................ F21S 43/50
362/546
(Continued)

FOREIGN PATENT DOCUMENTS

CN 206242622 U 6/2017
EP 3053778 A1 8/2016
(Continued)

OTHER PUBLICATIONS

PCT International Search Report and Written Opinion dated Feb. 6, 2020 for International Application No. PCT/EP2019/079206, 9 pages.
(Continued)

*Primary Examiner* — Ashok Patel

(57) ABSTRACT

A trim for an object and its method of manufacture involve providing a transparent or translucent substrate defining a top surface, applying an opaque layer above the top surface of the substrate, the opaque layer defining one or more apertures through which light can pass, and applying one or more translucent metallic-looking layers above a top surface of the opaque layer. In some implementations, the trim is a selectively illuminable trim whereby a light source is arranged beneath a bottom surface of the substrate, the light source being configured to output light through the substrate, the one or more apertures defined by the opaque layer, and the one or more metallic-looking layers.

24 Claims, 6 Drawing Sheets

(51) Int. Cl.
  *F21V 11/14*  (2006.01)
  *C23C 14/04*  (2006.01)
  *C23C 14/58*  (2006.01)

(52) U.S. Cl.
  CPC .... *B60R 2013/0287* (2013.01); *C23C 14/042* (2013.01); *C23C 14/5873* (2013.01)

(56) References Cited

U.S. PATENT DOCUMENTS

| | | |
|---|---|---|
| 2015/0307033 A1 | 10/2015 | Preisler et al. |
| 2018/0274848 A1* | 9/2018 | Kim .................. F25D 23/00 |
| 2018/0281701 A1* | 10/2018 | Preisler ............... B60R 13/005 |

FOREIGN PATENT DOCUMENTS

| | | |
|---|---|---|
| WO | 2010144893 A2 | 12/2010 |
| WO | 2017052110 A1 | 3/2017 |
| WO | 2018225029 A1 | 12/2018 |

OTHER PUBLICATIONS

Office Action received for CN Application No. 201980065102.2, dated Dec. 14, 2021, 13 Pages (04 Pages of English Translation and 09 Pages of Official notification).

\* cited by examiner

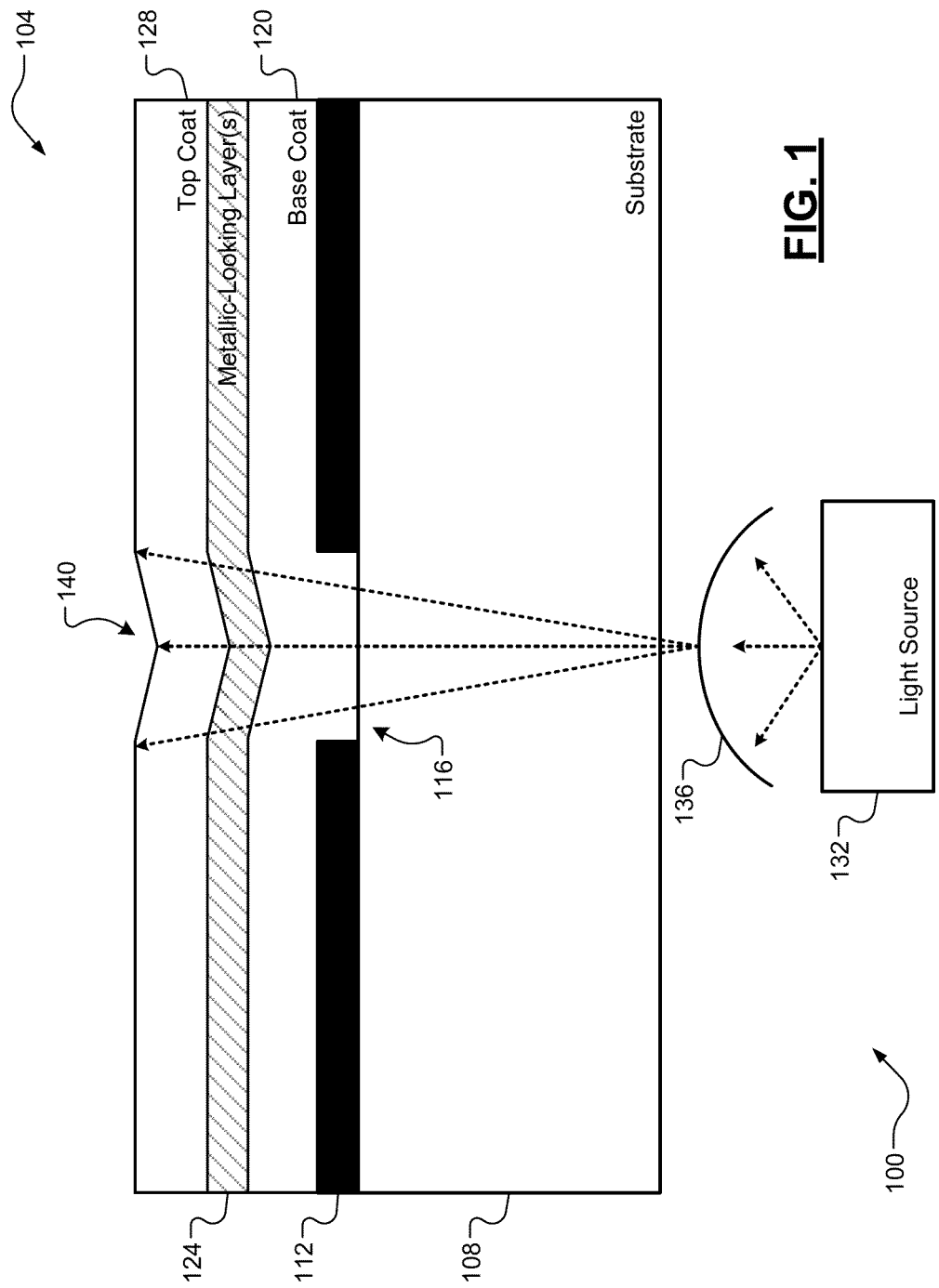

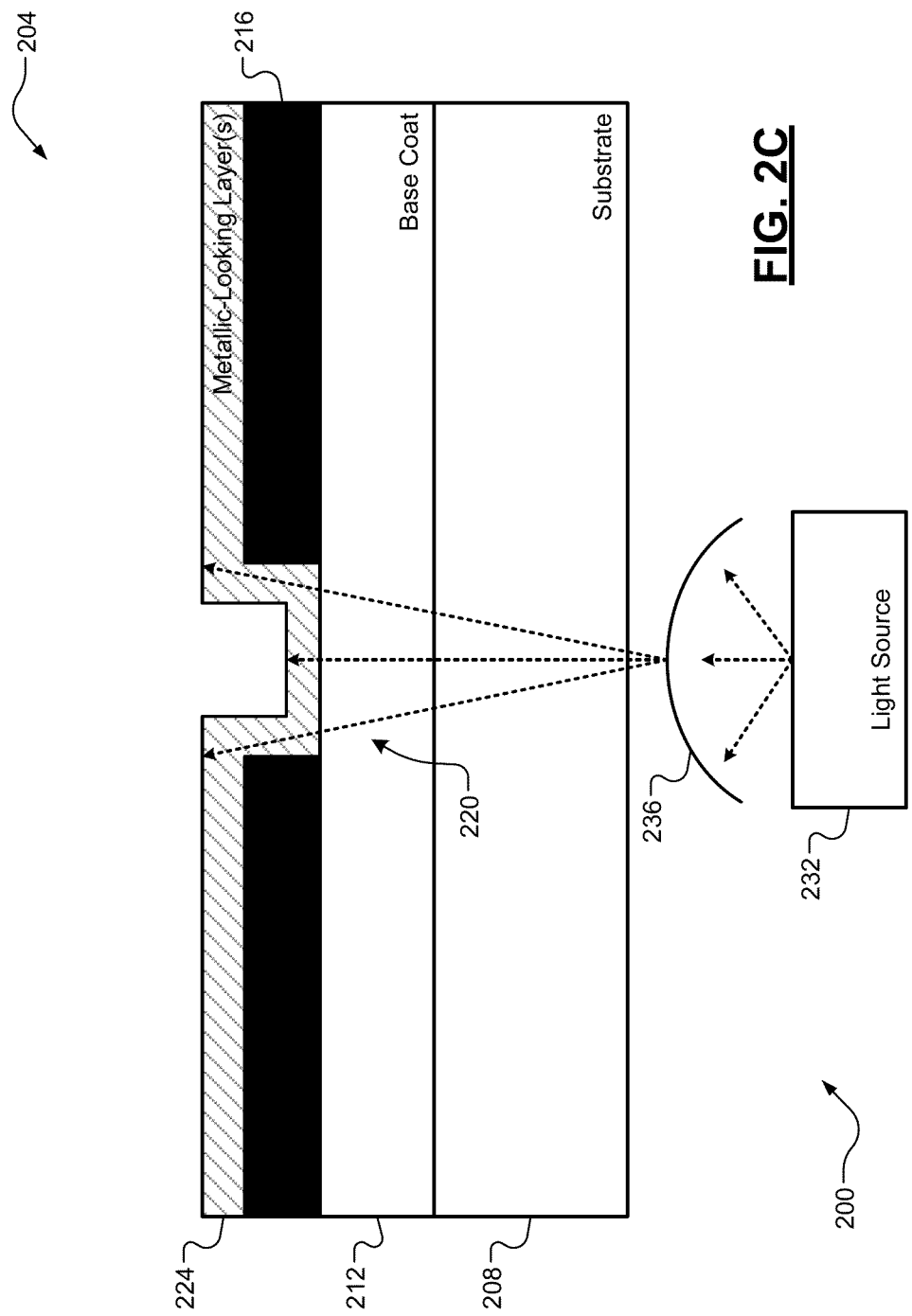

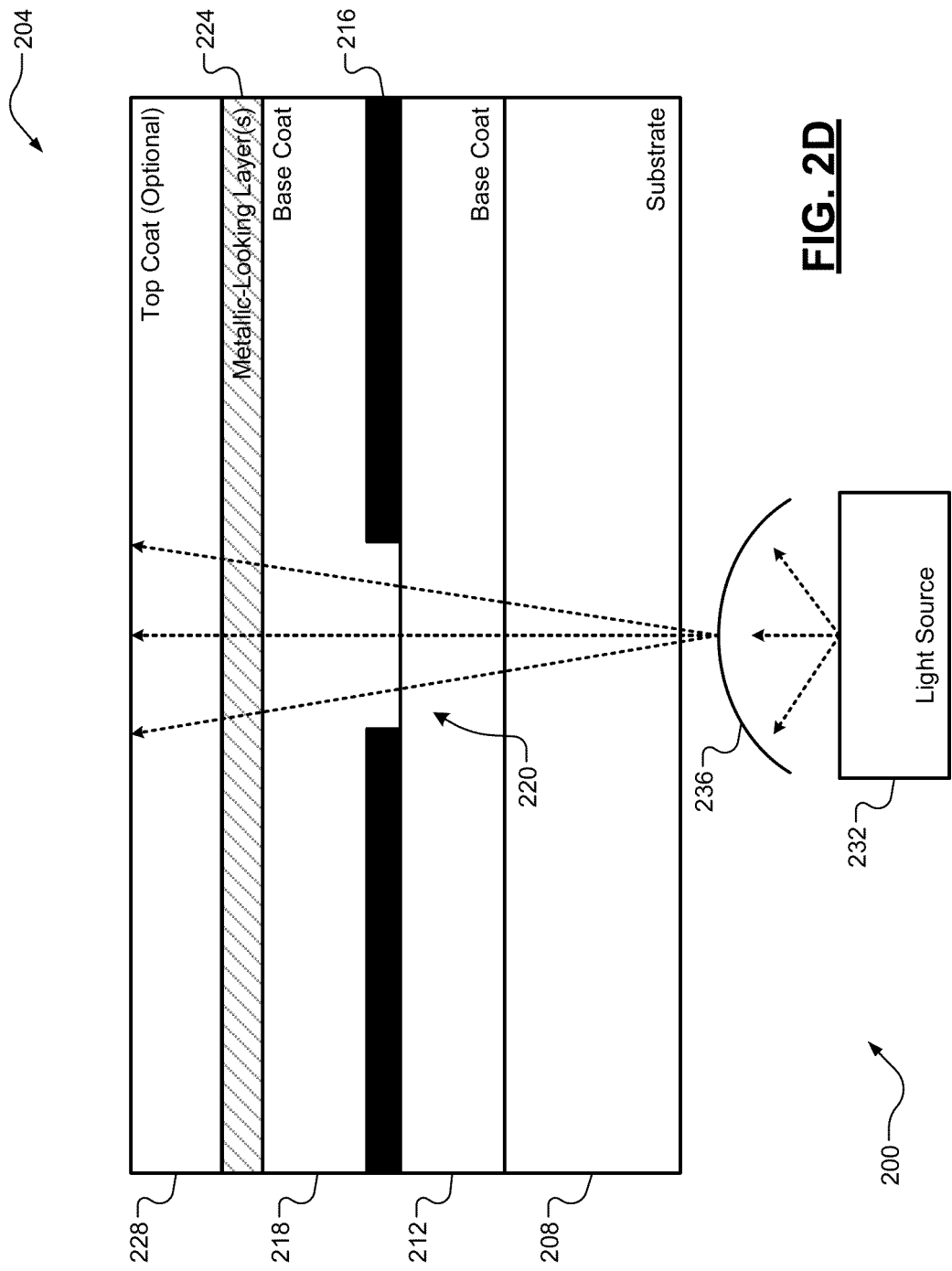

SELECTIVELY ILLUMINABLE METALLIC LOOKING TRIMS AND THEIR METHODS OF MANUFACTURE

CROSS-REFERENCE TO RELATED APPLICATIONS

This application is a 371 U.S. National Stage of International Application No. PCT/EP2019/079206, filed Oct. 25, 2019, which claims priority to Spanish Patent Application No. P201831040, filed Oct. 25, 2018. The disclosures of each of the above applications are incorporated herein by reference in their entirety.

FIELD

The present application generally relates to decorative trims and, more particularly, to selectively illuminable metallic looking trims and their methods of manufacture.

BACKGROUND

Decorative trims are applied to accent or enhance the visual appearance of an object. For example, vehicle interior and exterior components often have decorative trims. To further enhance the visual appearance of a decorative trim, light sources and light guides can be incorporated into the decorative trim to generate a lighting effect. Chrome plating is one example of a decorative trim that is often utilized due to its high gloss appearance. Chrome plating, however, can have a negative environmental impact, e.g., due to the use of hexavalent chromium baths. Chrome plating is also formed of one or more opaque metallic layers that do not allow light to pass through and thus it cannot be used in connection with back-lit lighting effects. Accordingly, while such decorative trims work well for their intended purpose, there remains a need for improvement in the relevant art.

SUMMARY

According to one aspect of the present disclosure, a trim for an object is presented. In one exemplary implementation, the trim comprises a transparent or translucent substrate defining a top surface, an opaque layer applied above the top surface of the substrate, the opaque layer defining one or more apertures through which light can pass, and one or more translucent metallic-looking layers applied above a top surface of the opaque layer.

In some implementations, the trim further comprises a first translucent base coat layer applied to the top surface of the substrate, wherein the opaque layer is applied to a top surface of the first translucent base coat layer. In some implementations, the trim further comprises a second translucent base coat layer applied to the top surface of the opaque layer and a portion of the top surface of the first translucent base coat layer corresponding to the one or more apertures, wherein the one or more translucent metallic-looking layers are applied to a top surface of the second translucent base coat layer. In some implementations, the trim further comprises a top coat layer applied to a top surface of the one or more metallic-looking layers.

In some implementations, the one or more apertures in the opaque layer are formed by pre-deposit masking or post-deposit laser etching. In some implementations, the one or more apertures in the opaque layer are formed by pre-deposit masking or post-deposit laser etching. In some implementations, at least the one or more metallic-looking layers are applied using a physical vapor deposition (PVD) system. In some implementations, at least the one or more metallic-looking layers are applied using a painting system.

In some implementations, the trim is a selectively illuminable trim that further comprises a light source arranged beneath a bottom surface of the substrate, the light source being configured to output light through the substrate, the one or more apertures defined by the opaque layer, and the one or more metallic-looking layers. In some implementations, the trim further comprises a light guide arranged between the light source and the bottom surface of the substrate, the light guide being configured to distribute the light output from the light source.

According to another aspect of the present disclosure, a method of manufacturing a trim for an object is presented. In one exemplary implementation, the method comprises: providing a transparent or translucent substrate defining a top surface, applying an opaque layer above the top surface of the substrate, the opaque layer defining one or more apertures through which light can pass, and applying one or more translucent metallic-looking layers above a top surface of the opaque layer.

In some implementations, the method further comprises applying a first translucent base coat layer to the top surface of the substrate, wherein the opaque layer is applied to a top surface of the first translucent base coat layer. In some implementations, the method further comprises applying a second translucent base coat layer to the top surface of the opaque layer and a portion of the top surface of the first translucent base coat layer corresponding to the one or more apertures, wherein the one or more translucent metallic-looking layers are applied to a top surface of the second translucent base coat layer. In some implementations, the method further comprises applying a top coat layer to a top surface of the one or more metallic-looking layers.

In some implementations, the method further comprises one of (i) applying a mask to the top surface of the substrate prior to applying the opaque layer, wherein the mask defines the one or more apertures, and (ii) laser etching the opaque layer to form the one or more apertures. In some implementations, the method further comprises one of (i) applying a mask to the top surface of the first translucent base coat layer prior to applying the opaque layer, wherein the mask defines the one or more apertures, and (ii) laser etching the opaque layer to form the one or more apertures. In some implementations, at least the one or more metallic-looking layers are applied using a PVD system. In some implementations, at least the one or more metallic-looking layers are applied using a painting system.

In some implementations, the trim is a selectively illuminable trim and the method further comprises arranging a light source beneath a bottom surface of the substrate, the light source being configured to output light through the substrate, the one or more apertures defined by the opaque layer, and the one or more metallic-looking layers. In some implementations, the method further comprises arranging a light guide between the light source and a bottom surface of the substrate, the light guide being configured to distribute the light output from the light source.

Further areas of applicability of the teachings of the present disclosure will become apparent from the detailed description, claims and the drawings provided hereinafter, wherein like reference numerals refer to like features throughout the several views of the drawings. It should be understood that the detailed description, including disclosed embodiments and drawings referenced therein, are merely exemplary in nature intended for purposes of illustration only and are not intended to limit the scope of the present disclosure, its application or uses. Thus, variations that do not depart from the substance of the present disclosure are intended to be within the scope of the present disclosure.

BRIEF DESCRIPTION OF THE DRAWINGS

FIG. 1 is a cross-sectional view of a defective selectively illuminable trim formed via A-side masking of primer layers.

FIGS. 2A-2D are cross-sectional views of different configurations of a selectively illuminable trim according to the principles of the present disclosure.

DETAILED DESCRIPTION

Figure 2A:
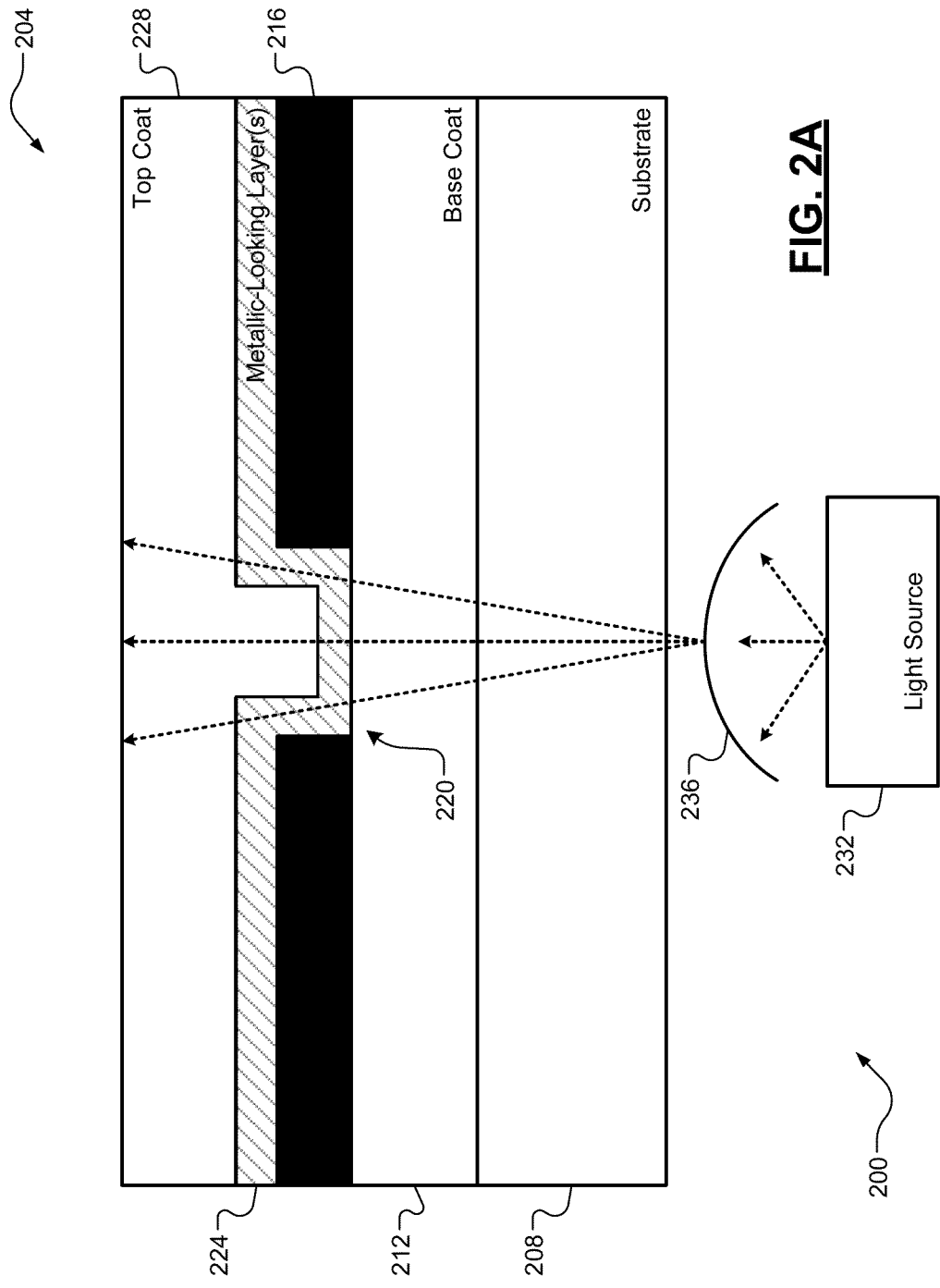
Figure 2B:
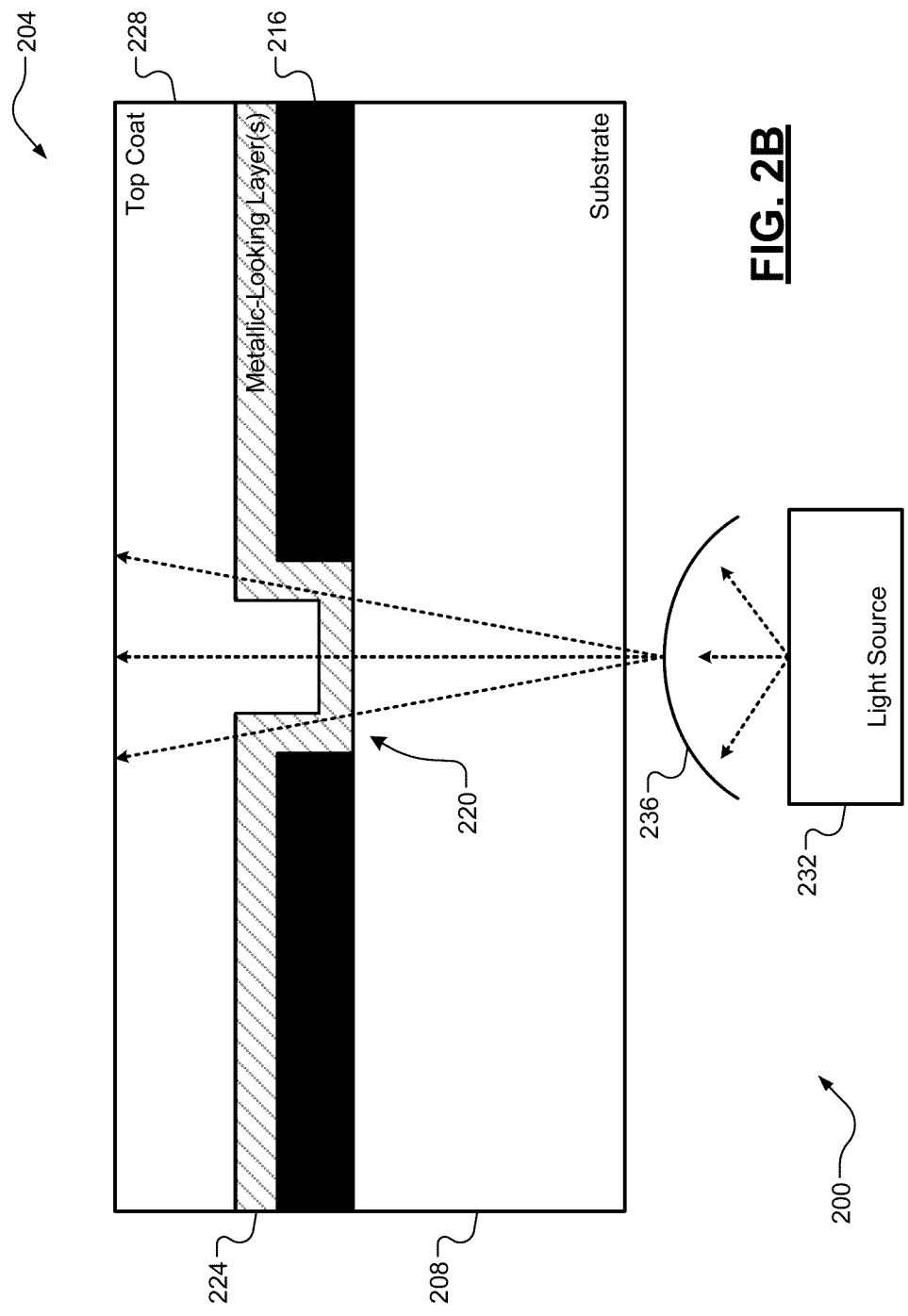

As discussed above, chrome plating is formed of one or more opaque metallic layers that do not allow light to pass through, which makes it unusable for decorative trim having back-lit lighting effects. Chrome plating also attenuates radar transmission. Additionally, B-side masking (i.e., applying the opaque layer to a back surface of the substrate) can result in distortion, particularly when being viewed at an angle. Accordingly, improved selectively illuminable metallic looking trims having A-side masking and their methods of manufacture are presented. In other aspects of the present disclosure, metallic looking trims comprising multiple stacked layers along with a light source and an optional light guide are packaged together to form single integrated modules. In some embodiments, these trims utilize a metallic-looking layer or coating and an opaque back layer to achieve a metallic looking component that is as aesthetically pleasing as chrome plating. In some embodiments, one or more base coat primer layers are applied. For example, a first base coat primer layer could be applied between the substrate and the opaque layer. An optional second base coat layer could also be applied between the opaque layer and the metallic-looking layer. In some embodiments, a top coat layer is applied atop the metallic looking layer.

Referring now to FIG. 1, a cross sectional view of a defective selectively illuminable decorative trim 100 formed via A-side masking of primer layers is illustrated. The trim 100 comprises a stack 104 formed of multiple stacked layers. A transparent or translucent substrate 108 forms a base of the stack 104. Non-limiting examples of the substrate 108 include plastic or polymer materials, such as polycarbonates (PC), polymethyl methacrylates (PMMA), acrylonitrile butadiene styrenes (ABS), styrene acrylics, styrene acrylonitrile polymers, polyamides, and combinations thereof. For vehicle trim applications, the substrate 108 could be an interior component (a dash assembly, a center console assembly, a multimedia or infotainment unit assembly, a door trim panel, etc.) or an exterior body component (front or side grille assemblies, bumper or fender accents, head or taillight accents, a trunk lid finisher, etc.). It will be appreciated that the systems and methods described herein are not limited to automotive applications and could be applicable to decorative trims for non-automotive applications (appliances and consumer goods, railway, motorbikes, aerospace, etc.).

An opaque layer 112 is applied to a top surface of the substrate 108. The opaque layer 112, while illustrated as a black primer layer, could have any suitable color or composition that prevents or substantially mitigates light transmission therethrough. Non-limiting examples of the opaque layer 112 comprise epoxy-based, polyurethane-based, and acrylic-based curable wet paints having opaque color pigments and combinations thereof. The opaque layer 112 defines one or more gaps or apertures 116, formed via pre-deposit masking or post-deposit laser etching, through which light is able to pass. The one or more apertures 116 correspond to a designed lighting accent effect, such as, for example, an accent, logo, indicia, icon, motif, pattern, button, or other similar accent for the object associated with the trim. A translucent base coat primer layer 120 is applied to a top surface of the opaque layer 112 as well as to the top surface of the substrate 108 in areas corresponding to the one or more apertures 116. Non-limiting examples of the base coat layer 120 include epoxy-based, polyurethane-based, and acrylic-based curable wet paints that are transparent or translucent and combinations thereof.

One or more translucent metallic-looking layers 124 are applied (e.g., via physical vapor deposition, or PVD) to a top surface of the base coat layer 120. It will be appreciated that the term "metallic-looking" as used herein refers to an at least partially transparent layer that looks metallic or otherwise provides a "metallic effect." For example, two or more layers could achieve the optimal aesthetics (base coat layer 120+single metallic-looking layer 124, single primer layer 120+two metallic-looking layers 124, two metallic-looking layers 124 and no primer layer 120, etc.). The metallic-looking layer 124 is translucent because it is formed of a material or coating comprising elements that are translucent (i.e., at least partially light-transmissive) such as, but not limited to, transition metals, post-transition metals, metalloids, and combinations thereof (e.g., alloys, such as oxides and oxide alloys). For example only, the metallic-looking layer could be a paint solution comprising flakes of one or more of the elements described above or a coating formed via sublimiation of one or more of the elements described above via PVD or a similar technique. It will be appreciated that metallic flakes or similar materials could also be included in the primer layer 120 to further enhance the metallic look or effect. The thickness of the metallic-looking layer 124 should be such that it remains at least translucent when illuminated by back-lighting while also looking metallic when not illuminated. The translucency of a metallic layer could also be affected by the chemical composition of the layer and dispersion of elements as reflected.

The metallic-looking layer 124 could also comprise multiple layers of a single metallic-looking material or different metallic-looking materials applied in various stages to achieve the desired optical properties. An optional top coat layer 128 could be finally applied to a top surface of the metallic-looking layer 124. Non-limiting examples of the top coat layer 128 include epoxy-based, polyurethane-based, and acrylic-based curable wet paints that are transparent or translucent and combinations thereof. The optional top coat layer 128 could be applied to both protect the metallic-looking layer 124 (e.g., from chipping, stripping, or scratching) and/or to further enhance the visual aesthetics of the metallic-looking layer 124 (e.g., by enhancing its glossy appearance). It will be appreciated that the top coat layer 128 could further include metallic flakes or similar materials to further enhance the metallic-looking of the metallic-looking layer(s) 124. It will also be appreciated that the top coat layer 128 could also be tinted and/or colored to further enhance this metallic look or effect. Non-limiting examples of this include a blue metallic-look, a copper metallic-look, and a bronze metallic-look, but any tinting and/or coloring combinations could be utilized.

The trim 100 further comprises a light source 132 (e.g., a light-emitting diode (LED), organic LED (OLED), optical fiber, electroluminescent, or a similar device, such as a laser light source) and an optional light guide 136 for directing, focusing, or distributing the light generated from the light source 132 through the substrate 108 and the one or more apertures 116 to form a visible field. As shown, a defect 140 occurs due to the aperture 116 formed in the opaque layer 112. More particularly, the base coat or primer layer 120 never forms a flush top surface. The resulting defect 140 appears similar to a sink mark, which propagates through each of the various layers 120, 124, 128. This defect 140 could be perceivable to a human by touch (e.g., on the top surface of the metallic-looking layer(s) 124 or the top coat 128) and/or by view. For example, the defect 140 could cause a visible distortion in the visible field projected by the light source 132 and the optional light guide 136. As a result of this defect 140, there remains a need for improvement in the manufacture of selectively illuminable metallic-looking trims.

Referring now to FIGS. 2A-2D, various configurations of a second embodiment of a selectively illuminable metallic looking trim 200 are illustrated. The trim 200 comprises a stack 204 formed of multiple stacked layers, which can have the same or similar composition as the layers of stack 104 in FIG. 1 as described above. In FIG. 2A, a first base coat primer layer 212 is applied to the top surface of a substrate 208. It will be appreciated, however, that the first base coat layer 212 could be optional (see, e.g., FIG. 2B). An opaque layer 216 is then applied to either the top surface of the substrate 208 (FIG. 2B) or to the top surface of the first base coat layer 212 (FIGS. 2A and 2C-2D). The opaque layer 216 defines one or more apertures 220, which could be formed via pre-deposit masking or post-deposit laser etching or another suitable process. A second base coat primer layer 218 could optionally be applied to a top surface of the opaque layer 216 and a portion of the top surface of the first base coat layer 212 corresponding to the one or more apertures 220. A metallic-looking layer 224, which could comprise multiple layers that are sequentially applied, is applied to either, is applied to either a top surface of the second base coat layer 218 (FIG. 2D) or to the top surface of the opaque layer 216 and a portion of the top surface of the substrate 208 (FIG. 2B) or a portion of the top surface of the first base coat layer 212 (FIGS. 2A and 2C) corresponding to the one or more apertures 220. A top coat layer 228 is optionally applied to a top surface of the metallic-looking layer 224. Details regarding the different layer materials and their methods of application, as well as the packaging of the stack 204 with a light source 232 and an optional light guide 236 to form a single integrated selectively illuminable trim module, are discussed below. It will also be appreciated that the thicknesses of the various layers of stack 204 (and stack 104) are not to scale. In one exemplary implementation, the substrate thickness is approximately 2-3 millimeters, the base coat thickness is approximately 20 microns, and the opaque and metallic-looking layer combined thickness is approximately 40-150 nanometers.

Figure 3:
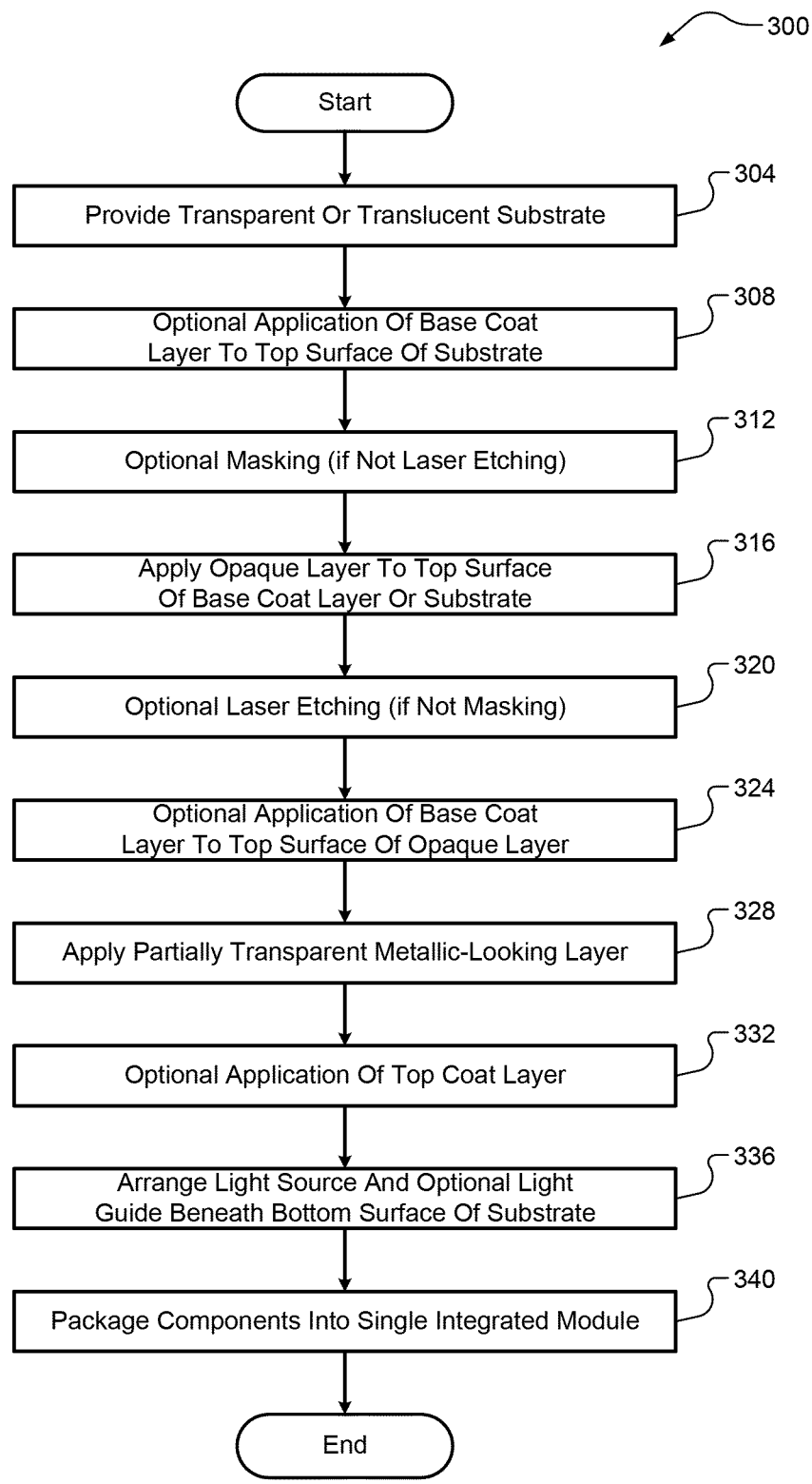
FIG. 3 is a flow diagram of a method of manufacturing the selectively illuminable trim according to the principles of the present disclosure.

Referring now to FIG. 3, a flow diagram of a method 300 of manufacturing the second embodiment of the trim 200 of FIGS. 2A-2D is illustrated. At 304, the transparent or translucent substrate 108 is obtained. The substrate 108 could be formed, for example, using any suitable plastic or polymer processing technique including, but not limited to, injection molding, extrusion, compression molding, thermoforming, and additive manufacturing (e.g., three-dimensional (3D) printing). As previously mentioned, non-limiting examples of the substrate 108 include plastic or polymer materials, such as PC, PMMA, ABS, styrene acrylics, styrene acrylonitrile polymers, polyamides, and combinations thereof. In one exemplary implementation, the substrate is a plastic interior component or exterior body component of a vehicle as previously described herein. At optional 308, base coat primer layer 112 is applied to the top surface of the substrate 108. As previously mentioned, non-limiting examples of the base coat layer 120 include epoxy-based, polyurethane-based, and acrylic-based curable wet paints that are transparent or translucent and combinations thereof. At optional 312, masking is performed. This could include applying a patterned layer that will not allow the opaque layer material to adhere, thereby forming the one or more apertures 220. This masking step could be performed, for example, when laser etching is not being used.

At 316, the opaque layer 216 is applied. As previously discussed, the opaque layer 216 could be applied via PVD, chemical vapor deposition (CVD), a paint application, or another similar technique. At optional 320, laser etching is performed to form the one or more apertures 220 in the opaque layer 216. This laser etching step could be performed, for example, when masking is not being used. At optional 324, a second base coat primer layer 218 could be applied to the top surface of the opaque layer 216 and a portion of the top surface of the first base coat layer 212 corresponding to the one or more apertures 220. Non-limiting examples of the second base coat layer 218 include epoxy-based, polyurethane-based, and acrylic-based curable wet paints that are transparent or translucent and combinations thereof. At 328, the metallic-looking layer 224 is applied. In some embodiments, the metallic-looking layer 224 and the one or more base coat layers 212, 218 are applied by a PVD system. In one exemplary implementation, the PVD system is a magnetron sputtering system. At optional 332, the top coat layer 228 is applied. As previously mentioned, non-limiting examples of the top coat layer 128 include epoxy-based, polyurethane-based, and acrylic-based curable wet paints that are transparent or translucent and combinations thereof. In some implementations, the top coat layer 228 is formed such that it has a substantially flush top surface (see, e.g., FIG. 2B). Steps 336 and 340 relate to the packaging of the stack 204, a light source 232, and an optional light guide 236 into a single integrated module.

The techniques of the present disclosure provide other benefits beyond the elimination of the A-side masking defect illustrated in FIG. 1. These techniques allow for better matching to the appearance of non-translucent or opaque PVD applications. This is because a traditional translucent PVD stack is not as bright as a non-translucent or opaque PVD stack. One example non-translucent or opaque PVD stack is a chrome plated trim component, such as on a vehicle. Thus, these techniques allow for better matching of the resulting translucent, metallic-looking components to such chrome plated components.

Example embodiments are provided so that this disclosure will be thorough, and will fully convey the scope to those who are skilled in the art. Numerous specific details are set forth such as examples of specific components, devices, and methods, to provide a thorough understanding of embodiments of the present disclosure. It will be apparent to those skilled in the art that specific details need not be employed, that example embodiments may be embodied in many different forms and that neither should be construed to limit the scope of the disclosure. In some example embodiments, well-known procedures, well-known device structures, and well-known technologies are not described in detail.

The terminology used herein is for the purpose of describing particular example embodiments only and is not intended to be limiting. As used herein, the singular forms "a," "an," and "the" may be intended to include the plural forms as well, unless the context clearly indicates otherwise. The term "and/or" includes any and all combinations of one or more of the associated listed items. The terms "comprises," "comprising," "including," and "having," are inclusive and therefore specify the presence of stated features, integers, steps, operations, elements, and/or components, but do not preclude the presence or addition of one or more other features, integers, steps, operations, elements, components, and/or groups thereof. The method steps, processes, and operations described herein are not to be construed as necessarily requiring their performance in the particular order discussed or illustrated, unless specifically identified as an order of performance. It is also to be understood that additional or alternative steps may be employed.

Although the terms first, second, third, etc. may be used herein to describe various elements, components, regions, layers and/or sections, these elements, components, regions, layers and/or sections should not be limited by these terms. These terms may be only used to distinguish one element, component, region, layer or section from another region, layer or section. Terms such as "first," "second," and other numerical terms when used herein do not imply a sequence or order unless clearly indicated by the context. Thus, a first element, component, region, layer or section discussed below could be termed a second element, component, region, layer or section without departing from the teachings of the example embodiments.

The foregoing description of the embodiments has been provided for purposes of illustration and description. It is not intended to be exhaustive or to limit the disclosure. Individual elements or features of a particular embodiment are generally not limited to that particular embodiment, but, where applicable, are interchangeable and can be used in a selected embodiment, even if not specifically shown or described. The same may also be varied in many ways. Such variations are not to be regarded as a departure from the disclosure, and all such modifications are intended to be included within the scope of the disclosure.

It should be understood that the mixing and matching of features, elements, methodologies and/or functions between various examples may be expressly contemplated herein so that one skilled in the art would appreciate from the present teachings that features, elements and/or functions of one example may be incorporated into another example as appropriate, unless described otherwise above.

What is claimed is:

1. A trim for an object, the trim comprising:
    a transparent or translucent substrate defining a top surface;
    an opaque layer applied above the top surface of the substrate, the opaque layer defining an aperture through which light can pass; and
    one or more translucent metallic-looking layers applied above a top surface of the opaque layer,
    wherein the metallic-looking layer comprises a radar-transmissive composition comprising one of (i) a metalloid and a (ii) a minority percentage of a metal.

2. The trim of claim 1, further comprising a first translucent base coat layer applied to the top surface of the substrate, wherein the opaque layer is applied to a top surface of the first translucent base coat layer.

3. The trim of claim 2, further comprising a second translucent base coat layer applied to the top surface of the opaque layer and a portion of the top surface of the first translucent base coat layer corresponding to the aperture, wherein the one or more translucent metallic-looking layers are applied to a top surface of the second translucent base coat layer.

4. The trim of claim 2, wherein the aperture in the opaque layer are formed by pre-deposit masking or post-deposit laser etching.

5. The trim of claim 1, further comprising a top coat layer applied above the one or more metallic-looking layers.

6. The trim of claim 1, wherein the aperture in the opaque layer are formed by pre-deposit masking or post-deposit laser etching.

7. The trim of claim 1, wherein at least the one or more metallic-looking layers are applied using a physical vapor deposition (PVD) system.

8. The trim of claim 7, wherein the metal is one of a transition metal and a post-transition metal and the PVD applies a coating formed via sublimation of the composition comprising the minority percentage of the metal to form the one or more metallic looking layers.

9. The trim of claim 1, wherein at least the one or more metallic-looking layers are applied using a painting system.

10. The trim of claim 9, wherein the metal is one of a transition metal and a post-transition metal and the painting system applies a paint solution comprising the composition comprising the minority percentage of the metal as flakes in the paint solution to form the one or more metallic looking layers.

11. The trim of claim 1, wherein the trim is a selectively illuminable trim that further comprises a light source arranged beneath a bottom surface of the substrate, the light source being configured to output light through the substrate, the aperture defined by the opaque layer, and the one or more metallic-looking layers.

12. The trim of claim 11, further comprising a light guide arranged between the light source and the bottom surface of the substrate, the light guide being configured to distribute the light output from the light source.

13. A method of manufacturing a trim for an object, the method comprising:
    providing a transparent or translucent substrate defining a top surface;
    applying an opaque layer above the top surface of the substrate, the opaque layer defining an aperture through which light can pass; and
    applying one or more translucent metallic-looking layers above a top surface of the opaque layer,
    wherein the metallic-looking layer comprises a radar-transmissive composition comprising one of (i) a metalloid and a (ii) a minority percentage of a metal.

14. The method of claim 13, further comprising applying a first translucent base coat layer to the top surface of the substrate, wherein the opaque layer is applied to a top surface of the first translucent base coat layer.

15. The method of claim 14, further comprising applying a second translucent base coat layer to the top surface of the opaque layer and a portion of the top surface of the first translucent base coat layer corresponding to the aperture, wherein the one or more translucent metallic-looking layers are applied to a top surface of the second translucent base coat layer.

16. The method of claim 14, further comprising one of (i) applying a mask to the top surface of the first translucent base coat layer prior to applying the opaque layer, wherein the mask defines the aperture, and (ii) laser etching the opaque layer to form the aperture.

17. The method of claim 13, further comprising applying a top coat layer above the one or more metallic-looking layers.

18. The method of claim 13, further comprising one of (i) applying a mask to the top surface of the substrate prior to applying the opaque layer, wherein the mask defines the aperture, and (ii) laser etching the opaque layer to form the one or more apertures.

19. The method of claim 13, wherein at least the one or more metallic-looking layers are applied using a physical vapor deposition (PVD) system.

20. The method of claim 19, wherein the metal is one of a transition metal and a post-transition metal and the PVD applies a coating formed via sublimation of the composition comprising the minority percentage of the metal to form the one or more metallic looking layers.

21. The method of claim 13, wherein at least the one or more metallic-looking layers are applied using a painting system.

22. The trim of claim 21, wherein the metal is one of a transition metal and a post-transition metal and the painting system applies a paint solution comprising the composition comprising the minority percentage of the metal as flakes in the paint solution to form the one or more metallic looking layers.

23. The method of claim 13, wherein the trim is a selectively illuminable trim and the method further comprises arranging a light source beneath a bottom surface of the substrate, the light source being configured to output light through the substrate, the aperture defined by the opaque layer, and the one or more metallic-looking layers.

24. The method of claim 23, further comprising arranging a light guide between the light source and a bottom surface of the substrate, the light guide being configured to distribute the light output from the light source.

* * * * *